US006632733B2

United States Patent
Mohammed (10) Patent No.: US 6,632,733 B2
(45) Date of Patent: Oct. 14, 2003

(54) COMPONENTS AND METHODS WITH NESTED LEADS

(75) Inventor: Ilyas Mohammed, San Jose, CA (US)

(73) Assignee: Tessera, Inc., San Jose, CA (US)

(*) Notice: Subject to any disclaimer, the term of this patent is extended or adjusted under 35 U.S.C. 154(b) by 0 days.

(21) Appl. No.: 09/808,461

(22) Filed: Mar. 14, 2001

(65) Prior Publication Data

US 2002/0130406 A1 Sep. 19, 2002

(51) Int. Cl.[7] .............................................. H01L 21/44
(52) U.S. Cl. ...................... 438/614; 438/106; 438/15; 438/25; 438/26; 438/51; 438/55; 257/678; 439/55; 439/493
(58) Field of Search ................................ 438/614, 106, 438/15–25, 51, 26, 55–64; 257/678; 439/55, 493, 541

(56) References Cited

U.S. PATENT DOCUMENTS

| 4,893,172 A | * | 1/1990 | Matsumoto et al. ........... 357/79 |
| 5,086,337 A | * | 2/1992 | Noro et al. .................... 357/79 |
| 5,148,265 A | | 9/1992 | Khandros et al. .............. 357/80 |
| 5,148,266 A | | 9/1992 | Khandros et al. .............. 357/80 |
| 5,455,390 A | | 10/1995 | DiStefano et al. ........... 174/262 |
| 5,518,964 A | | 5/1996 | DiStefano et al. ........... 437/209 |
| 5,798,286 A | | 8/1998 | Faraci et al. ................. 438/113 |
| 5,802,699 A | | 9/1998 | Fjelstad et al. |
| 5,810,609 A | | 9/1998 | Faraci et al. |
| 5,812,378 A | | 9/1998 | Fjelstad et al. |
| 5,904,498 A | * | 5/1999 | Fjelstad ....................... 438/106 |
| 5,915,752 A | | 6/1999 | DiStefano et al. ............. 29/827 |
| 5,973,394 A | | 10/1999 | Slocum et al. |
| 6,157,048 A | | 12/2000 | Powell |
| 6,202,297 B1 | | 3/2001 | Faraci et al. |
| 6,286,205 B1 | * | 9/2001 | Faraci et al. .................. 29/837 |
| 2001/0011907 A1 | | 8/2001 | Farnworth et al. |
| 2002/0057171 A1 | | 5/2002 | Patel et al. |

FOREIGN PATENT DOCUMENTS

| WO | WO 97/11588 | 3/1997 |
| WO | WO 97/27627 | 7/1997 |
| WO | WO 98/44564 | 8/1998 |

* cited by examiner

Primary Examiner—Matthew Smith
Assistant Examiner—Granvill D. Lee, Jr.
(74) Attorney, Agent, or Firm—Lerner, David, Littenberg, Krumholz & Mentlik, LLP (57) ABSTRACT

A component for fabricating microelectronic assemblies has numerous curved leads on a surface. Each lead has a first anchor end fixed to the body of the component, a second tip end which can be bonded to a contact on a mating component and lifted away from the component body, and an elongated main portion which is bent away from the component body in the lifting action. The first anchor end of each lead is nested within the curved portion of another lead, so as to provide an extraordinarily compact arrangement suitable for use with components having closely spaced contacts as, for example, a semiconductor chip or wafer having a contact pitch less than 500 microns. The leads may be disposed in pairs, with the first anchor end of each lead encompassed by the main portion of the other lead in the same pair.

32 Claims, 7 Drawing Sheets

COMPONENTS AND METHODS WITH NESTED LEADS

FIELD OF THE INVENTION

The present invention relates to components and methods for making microelectronic assemblies.

BACKGROUND OF THE INVENTION

Microelectronic components such as semiconductor chips commonly incorporate numerous contacts exposed on a surface of an element as, for example, on the front surface of a semiconductor chip. These contacts must be connected to another as, for example, to contact pads on a circuit board so as to make the electrical connections between a chip and a larger circuit. Complex semiconductor chips incorporate hundreds of contact pads in a small area. The connections between the contacts on the chip should be reliable and should be manufacturable by an economical process. Moreover, the connections should be compact. In certain applications, it is desirable to mount a chip in such a way that the mounted chip occupies an area of the circuit board equal to or only slightly larger than the surface area of the chip itself. Although the contacts on a chip can be directly bonded to contact pads on a circuit board using a technique known as "flip-chip bonding," this approach suffers from some significant drawbacks. The assembly is heated by heat generated within the chip while the assembly is operating. When operation ceases, the assembly cools again. As the assembly is heated and cooled, the chip and substrate expand and contract by different amounts. The contact pads on the substrate tend to move with respect to the contacts of the chip, thus imposing substantial stresses on the solder balls. This can lead to fatigue failures of the connections in service, rendering the assembly unreliable. As disclosed in certain preferred embodiments of U.S. Pat. Nos. 5,148,265; 5,148,266; and 5,455,390, the disclosures of which are hereby incorporated by reference herein, a sheet-like, preferably flexible, connection component is mounted so as to overly a surface of the chip. The terminals on the connection component are connected to the contacts on the chip by flexible leads. The connection component is arranged so that the terminals are moveable with respect to the chip. For example, the connection component may incorporate compliant layers disposed between the terminals and the chip. The assembly of the connection component and chip provides a packaged chip which can be mounted to a circuit board. The terminals can be bonded to contact pads on the circuit board as, for example, by soldering or otherwise metallurgically bonding the terminals to the contact pads of the circuit board. Because some or all of the terminals overlie the surface of the chip, the area occupied by the assembly can be approximately the same as the area of the chip front surface or only slightly larger than such area. Because the terminals are moveable with respect to the chip, differential thermal expansion of the chip and circuit board does not impose large stresses on the bonds between the terminals and the circuit board.

U.S. Pat. No. 5,518,964 ("the '964 patent"), the disclosure of which is incorporated by reference herein, discloses further improvements. As disclosed in certain preferred embodiments of the '964 patent, an array of leads can be formed on a first surface of a sheet-like dielectric connection component. Each lead has a fixed or anchor end permanently attached to the connection component and a tip end remote from the anchor end. The anchor ends of the leads typically are connected to terminals on the second side of the sheet-like component. The tip ends of the leads are releasably connected to the connection component. The tip ends of the leads are disposed in positions corresponding to the positions of the contacts on the chip.

The connection component is juxtaposed with the chip, with the lead-bearing first surface of the component facing toward the contact-bearing surface of the chip. The connection component is aligned with the chip so as to align all of the tip ends of the leads with the appropriate terminals, and the tip ends of the leads are bonded to the contacts on the chip. The connection component is then moved through a preselected displacement in a direction away from the contact-bearing surface of the chip, commonly referred to as a "vertical" direction, thereby detaching the tip ends of the leads from the connection component and bending the leads towards a vertically-extensive disposition, leaving the leads free to flex. The step of moving the elements vertically away from one another is commonly referred to as "lifting". Preferably, a curable liquid is introduced into the space between the chip and the connection component during or after the lifting step and cured to form a compliant layer between the chip and the connection component. Because the tip ends of the leads are held in position during the alignment and bonding process, all of the tip ends can be bonded in a single operation. This process is particularly well suited for use with chips having a large number of contacts. This process can be used with individual chip or with elements incorporating many chips such as an entire wafer. All of the connections can be made in a single bonding operation and all of the leads can be bent in a single lifting operation. After these operations, the connection component and wafer can be severed to form individual packaged chip units, each including one chip or a few chips and a portion of the connection component associated with the chip or chips in such unit. Such a unit can be connected to a circuit board by bonding the terminals of the connection component to the circuit board, as discussed above. Here again, the terminals on the connection component are movable with respect to the chip so as to alleviate stress due to differential thermal expansion.

Other embodiments disclosed in the '964 patent include providing the leads initially on the surface of the chip, with the fixed ends of the leads permanently connected to the contacts of the chip and with the tip ends of the leads releasably connected to the chip. The chip is aligned with a structure such as a connection component or circuit panel having contact pads on the surface facing towards the chip. The tip ends are bonded to the contact pads and the two elements are moved away from one another so as to break the tip ends of the leads away from the surface of the chip and bend the leads in the same manner discussed above. In still other embodiments taught in the '964 patent, elements other than chips can be connected. For example, two connection components can be connected to one another. The leads are provided on one of the connection components, and the tip ends of the leads are bonded to contacts on the other connection component. The two components are moved away from one another so as to detach the tip ends of the leads from the first connection component and bend the leads towards a vertically extensive disposition.

In certain embodiments taught in the '964 patent, the leads, in their initial, undeformed, planar condition are curved in horizontal directions along the surface of the component or chip carrying the leads. This curvature provides slack in the leads after the leads are bent towards a vertically extensive disposition.

Components and methods as taught in the '964 patent provide numerous advantages. For example, the ability to make numerous connections reliably in a single series of operations greatly reduces the costs and simplifies the process. The resulting units or packaged chips can have a surface area approximately equal to the surface area of the chip itself. Although the process disclosed in the '964 patent can be applied to essentially any configuration of contacts on a chip, it is particularly well suited to forming connections with an element having contacts disposed in a two-dimensional array, commonly referred to as an "area array."

Despite these improvements, still further improvement would be desirable. In certain instances, a semiconductor chips or other component has contacts disposed in an area array with small contact-to-contact distances or "pitch." The tip ends of the leads must be disposed on the mating component at correspondingly small center-to-center distances, and the entire lead thus must fit within a small area. For example, in a chip having contacts disposed in a two-dimensional area array with a 300 micron (0.3 mm) center-to-center distance or pitch in both dimensions, the nominal area occupied by the array is only 0.09 $mm^2$ per contact. Because the contacts on the chip have a finite size, the clear area free of contacts is less than the nominal area per contact of the contact array. Each lead must be placed so that the tip end of the lead will be in registration with the desired contact on the chip when the chip and connection component are engaged with one another, but other portions of the lead will be registered with the clear area of the contact array and thus avoid engagement with neighboring contacts. This is necessary to avoid undesired connections between the lead and neighboring contacts. The available area for lead placement is reduced still further by the effects of tolerances. The leads must be placed on the connection component so that there is some finite clearance between the lead and the neighboring contacts when the array of leads is registered with the neighboring contacts, so that undesired connections do not occur even if the leads are slightly misplaced on the connection component or the connection component is slightly misaligned with the chip. The leads also must be placed on the component so that the leads do not touch one another after the leads are bent towards a vertical disposition during the lifting step.

It is desirable to provide leads of sufficient length to accommodate the vertical movement or lifting operation and to minimize stresses in the leads in service. Assemblies of this type having long leads will encounter lower bending stresses in the leads than otherwise comparable assemblies having short leads. Also, the leads typically must have enlarged portions at their anchor ends to provide for secure attachment of the anchor ends to the connection component. The leads commonly have slightly enlarged portions at their terminal ends to provide adequate for bonding to the contacts, and to aid in fabrication of certain releasable attachments to the underlying surface of the component.

All of these factors, taken together, contribute to a need for further improvements in the lead structures of lead-bearing components.

SUMMARY OF THE INVENTION

One aspect of the present invention provides components for making microelectronic assemblies comprising. A component according to this aspect of the invention desirably includes a body having a surface and a plurality of nested leads extending over said surface. Each of the nested leads has first and second ends and an elongated main portion extending between said ends. The leads are "nested" in that the main section of each nested lead is curved to encompass and partially the first end of another one of the leads. Thus, the main portions of each nested leads desirably surrounds an interior area on the surface, and the first end of each nested lead is disposed within the interior area encompassed by another one of the nested leads.

The nested leads desirably are arranged in groups or "unit cells", and the first end of each nested lead desirably is at least partially surrounded by the main portion of another lead in the same group. Most preferably, the nested leads are arranged in pairs, and the first end of each nested lead partially surrounded by the other lead in the same pair. In one preferred arrangement, the each nested lead is generally hook-shaped, with an enlarged disc-like region forming the first end of the lead and a narrow main portion extending in a partial loop from the first end. The two leads of the pair desirably are congruent with one another, but rotated 180° with respect to one another. The first ends are offset from one another in direction, arbitrarily referred to as the Y horizontal direction, and lie on a common central axis extending in the Y direction. The second ends of the leads are offset from one another in an X direction transverse to the Y direction, and are disposed remote from the central axis. As further explained below, the preferred components according to this aspect of the invention provide a uniquely compact lead arrangement with leads having main sections of substantial length. Typically, the first end of each lead serves as an anchor end and is fixed to the body of the component, whereas the second end of each lead is a tip end which is releasably attached to the body or movable with respect to the body.

A further aspect of the invention provides methods of making connections. A method according to this aspect of the invention desirably includes the step of providing first and second elements and a plurality of generally planar nested leads connected between these elements. Each nested leads desirably has a first end connected to the first element, a second end connected to the second element and an elongated main section extending between the first and second ends. Here again, the main section of each nested lead desirably is curved to encompass and partially surround the first end of another one of said nested leads. For example, the leads may be provided on a component as discussed above, which serves as the first element. Such a component can be juxtaposed with the second element and the second ends of the leads can be connected to contacts on the second element.

The method according to this aspect of the invention desirably includes a further step, referred to herein as a "lifting step", of moving the first and second elements away from one another with a component of motion in a vertical direction normal to the plane of the leads so as to bend said nested leads into a vertically-extensive disposition.

These and other objects, features and advantages of the invention will be more readily apparent from the detailed description of preferred embodiments set forth below, taken in conjunction with the accompanying drawings.

DETAILED DESCRIPTION

A component 10 in accordance with one embodiment of the invention includes a sheet-like dielectric element or base 12 such as a sheet of polyimide which may be approximately the same size or slightly larger than a semiconductor wafer which will be assembled to the component. As disclosed in the '964 patent and as described further in copending commonly assigned U.S. patent application Ser. Nos. 09/173,797 filed Oct. 16, 1998 and 09/174,074 filed Oct. 16, 1998, the component may be held in place in a rigid frame 14 during fabrication and during assembly with the wafer. The base 12 includes a large number of individual regions 16, each of which will provide terminals and connections to one chip on the wafer during use. The individual regions 16 are indicated by demarcation lines in FIG. 1 for clarity of illustration. In practice, these demarcation lines typically are not visible in the component. Each region 16 is approximately the same size as the front surface of a single chip.

Figure 2:
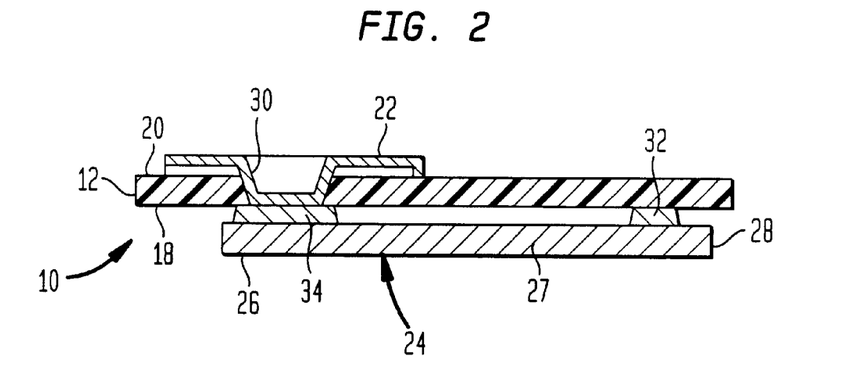
FIG. 2 is a diagrammatic sectional view of one element shown in FIG. 2, the view being taken along a curved cutting plane along the length of a single lead.

The dielectric sheet or base 12 has a first generally planar surface 18 and a second surface 20 on the opposite side of the sheet. A large number of terminals 22 are exposed at the second side of the sheet. Although the terminals depicted in FIG. 2 are illustrated as projecting from second surface 20, this is not essential; the terminals may be flush with the second surface or recessed slightly with respect to the second surface, provided that the terminals are exposed for contact with bonding materials during use of the product made from the component. Also, the terminals may be covered by a temporary layer or layers so as to protect the terminals during manufacturing operations, and this temporary layer or layers may be stripped away or etched to expose the terminals.

A large number of leads 24 are provided on the component. These leads extend over the first surface 18 of the sheet or base 12. As used in this disclosure, a statement that the leads extend over a surface of the base means that the leads overlie the surface and extend generally in a plane parallel to the surface, i.e., that the extent of the leads in directions along the plane of the surface is substantially greater than the extent of the leads in directions normal to the surface. However, the leads need not be in contact with the surface, and may deviate from perfect planarity. Each lead has a first or anchor end 26, a second or terminal end 28 at the opposite end of the lead, and an elongated main portion 27 extending between these ends. The first or anchor end 26 of the lead is permanently attached to the sheet or base 12. In the particular embodiment illustrated, the first or anchor end 26 of each lead is permanently secured to sheet 12 and connected to a single terminal 22 by a metallic via 30 extending through sheet 12 and by a metallic connection button 34 extending between via 30 and the first or anchor end 26 of the lead.

The second or tip end 26 of the lead and the main portion 27 are displaceable relative to the sheet or base 12. As used in this disclosure with reference to a feature of a lead, the term "displaceable" means that the feature is either freely moveable relative to the base or releasably attached to the base so that the feature can be broken away from the base as, for example, by peeling it away from the base without destroying the lead or the base. Most preferably, the tip ends of the leads are releasably attached to the base so that the tip ends will be held in position during the process steps discussed below. In the particular embodiment illustrated, the tip end of each lead is releasably connected to the base or sheet 12 by a small metallic button 32 extending from the first surface 18 to the lead itself, whereas the main portion 27 is not attached to the base 12.

As described in greater detail in the '964 patent, a component with such releasable attachments can be fabricated by providing a continuous layer of copper or other etchable metal on the base, and forming lads 24 from gold or other etch-resistant metal deposited on this layer. The component may then be exposed to an etchant which attacks the copper layer but which does not substantially attack the gold leads. The etchant progressively attacks the layer from the edges of the lead. Provided that the main section 27 has a smaller width than the ends 26 and 28, the process can be stopped at a time after the etchant has completely removed the layer between the main section and the sheet, but before the etchant has completely removed the layer at the ends. Other forms of releasable attachment may be provided. For example, as disclosed in copending, commonly assigned U.S. patent application Ser. No. 09/566,273, the disclosure of which is incorporated by reference herein, a releasable attachment at the tip end may be formed by providing leads directly on the first surface 18 of the sheet and etching the sheet using an etchant which attacks the polymeric material of the sheet, but which does not substantially attack the metal of the lead. Alternatively, the releasable attachment may be provided by depositing the lead under conditions which result in only a weak adhesion between the tip end of the lead and the sheet.

Although the base or sheet 12 is illustrated as a simple sheet of polymeric material, the base may incorporate additional elements such as metallic potential plane elements within the interior of the base or on one or both surfaces in areas unoccupied by the leads. The base may further include electrically conductive traces extending on one or both surfaces in areas unoccupied by the leads and terminals or within the interior of the base. The fixed ends of the leads need not be directly connected to the terminals disposed at those ends. For example, the fixed ends of the leads may be connected to internal traces within or on base 12. Thus, the fixed end of one lead may be connected to a terminal at another location within the same region 16 of the component. Also, the leads may be connected to one another by the traces. Some of the leads intended to serve as power or ground leads may be connected to potential plane elements in or on base 12.

Figure 3:
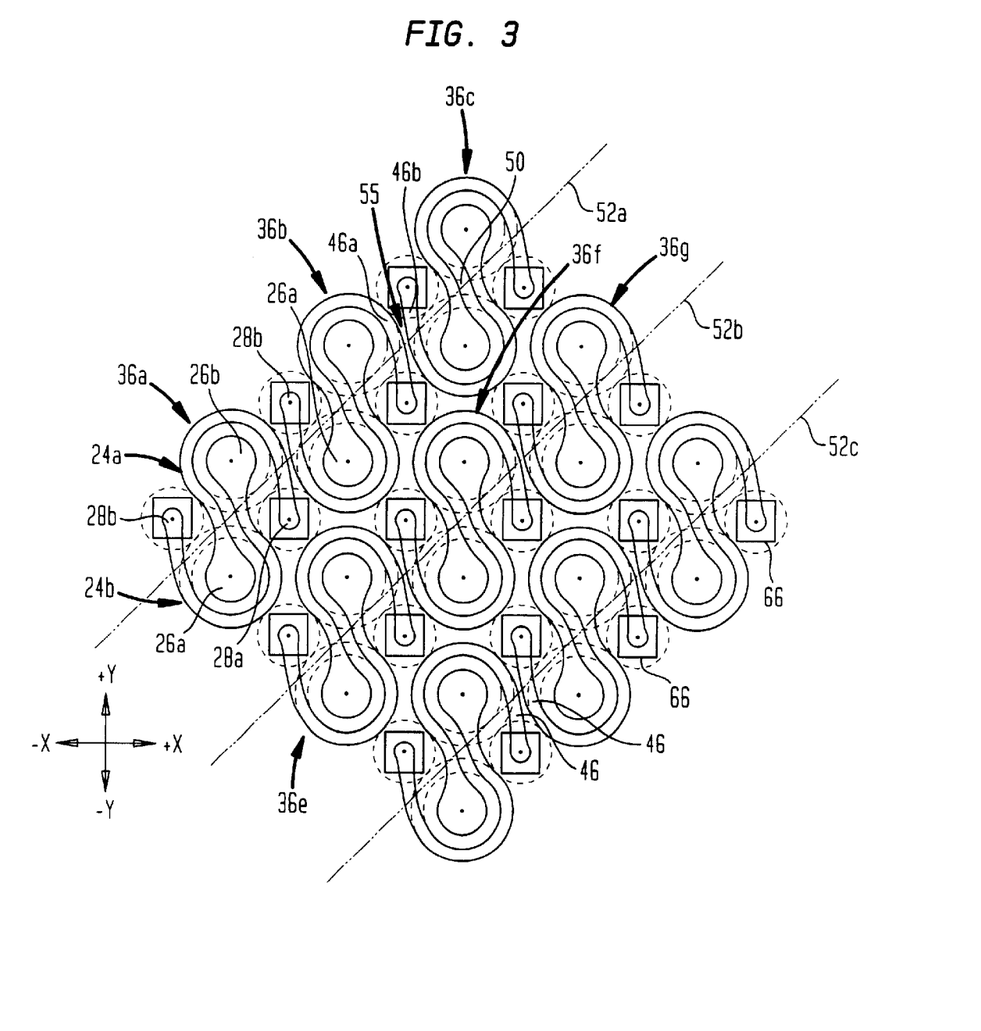
FIG. 3 is a fragmentary plan view of the element shown in FIGS. 1 and 2, depicting a portion of one surface of such element.
Figure 4:
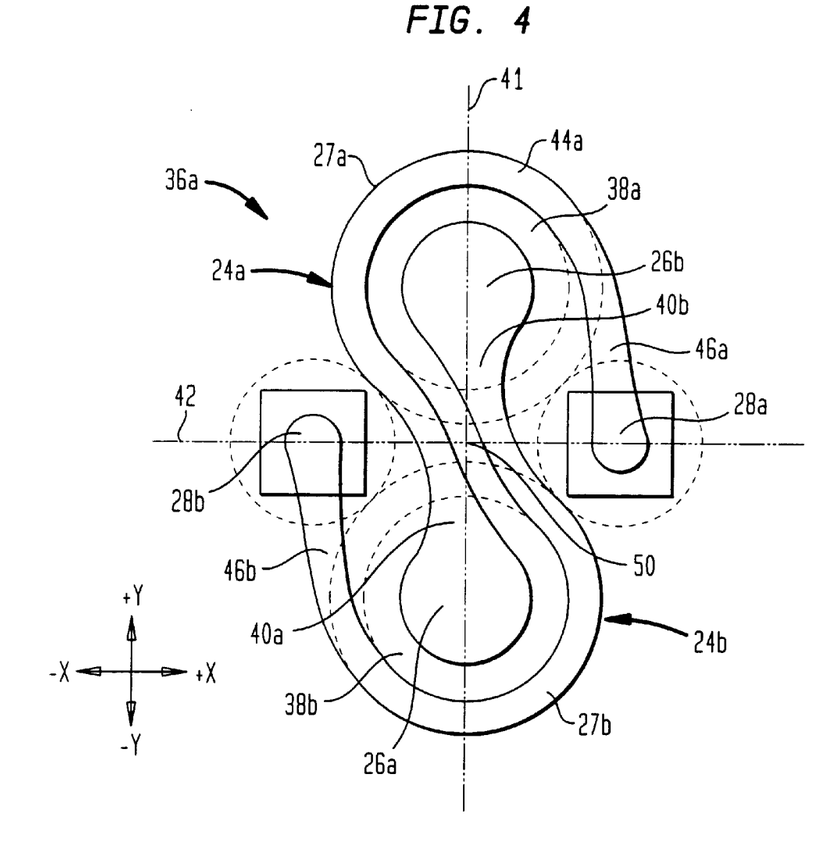
FIG. 4 is a fragmentary plan view on an enlarged scale of the area indicated in FIG. 3.

The geometry and layout of leads 24 is illustrated in FIGS. 3 and 4. As best seen in FIG. 3, the leads are provided in groups or unit cells 36. Each unit cell 36 includes a pair of leads 24a and 24b. The leads of each group or pair 36 are nested within one another. That is, the elongated main section of 27 of each lead is curved so as to partially surround an interior area, and the first or anchor end 26 of the other lead in of the same pair is disposed within this interior area. For example, the elongated main section 27a of the first lead in pair 36a (FIG. 4) partially surrounds an interior area 38a of the first surface 18. The first or anchor end 26b of the second lead in of the same pair is disposed within this interior area. Conversely, the elongated main portion 27b of the second lead in the same pair 36a defines an interior area of 38b and the first or anchor end 26a of the first lead is disposed within this interior area 38b. Stated another way, each lead is generally hook-shaped, and the two leads are disposed in opposite orientation so that the main portion 27 of each lead in the pair partially encircles the first end 26 of the other lead in the same pair.

The first or anchor in 26 of each lead has a substantially greater width than of the elongated main section 27 of the lead. As used in this disclosure with reference to features of a lead, the term "width" refers to the dimension of the feature in the direction perpendicular to the direction of elongation of the lead. With respect to a lead which is curved, so that the direction of elongation changes along the length of the lead, the term "width" refers to the dimension in the direction perpendicular to the direction of elongation of the nearest portion of the lead which is elongated. In the particular embodiment illustrated, the first or anchor in 26 of each lead is generally circular, and its width is equal to its diameter. In the particular embodiment illustrated, the first or anchor in 26 of each lead has a diameter of 0.128 mm, whereas the width of the main section 27 of each lead is 0.03 mm. A tapered first-end transition section 40a is provided at the juncture between the first end 26a and main portion 27a of first lead 24a. The width of the lead progressively decreases within this transition section 40a in the distal direction, away from first end 26a. The second or tip 28a of each lead has a width slightly greater than the width of the main portion 27a, but less than the width of the first or anchor end. In the embodiment illustrated, the second or tip end 28a of each lead has a width of about 0.052 mm. In a tapered second end transition section 46a, the width of the lead progressively increases in the distal direction, from the main portion 27a to the second end 28a.

The directions and orientations of the leads and features of the leads can be described with reference to a conventional two dimensional Cartesian X-Y coordinate system, using directions labeled as shown in FIGS. 3 and 4. The X and Y directions are in a plane parallel to the first surface 18 of the base. These directions are referred to as "horizontal" directions. The first ends 26 of the two leads in each pair 36 are disposed on a common central axis 41 which extends parallel to the Y directions of the coordinate system. Thus, the first end 26a of the first lead 24a in each pair is aligned with the first end 26b of second lead in the same pair in the X directions. However the first end 26b of the second lead in the pair is offset in the +Y direction from the first end 26a of the first lead in the pair. The distance between the first ends in the is referred to herein as the first-end unit distance, and is 300 microns in the illustrated embodiment.

The second ends 28 of the two leads are disposed on a common transverse axis of 42 parallel to the X direction of the coordinate system. Thus, the second ends of the two leads are aligned with one another in the Y direction, but are offset from one another in the X direction. so that the second ends lay on opposite sides of the central axis 41. Thus, the second end 28b of the second lead is offset in the −x direction from the second end 28a of the first lead. The distance between the second or tip ends 28 of the pair is referred to herein as the second-end unit distance. In the embodiment illustrated, the second-end unit distance is equal to the first end unit distance, i.e., 300 microns. Where the first end unit distance and the send end unit distance are equal to one another, the term "unit distance" standing alone, refers to that distance.

The first-end transition sections of 40 of each lead curve away from the central axis 41 in opposite directions. Thus, the first-end transition section 40a and the immediately adjacent region of the main portion of 27a of first lead 24a extend in the +Y direction from the first end 26a of that lead and slope in the −X direction, away from central axis 41. These parts of the lead curve generally in an arc having its radius of curvature offset from the lead in the −X direction, and merge into a bight 44a in the form of a sector of a circle concentric with the circular portion of the first end 26b of the opposite lead in the pair. Bight 44a has a substantially constant radius over the major portion of its circumference, but progressively increases in radius at its juncture with second end transition portion 46a. The second end transition portion 46a of the first lead 27a extends the −Y direction and slopes slightly in the +X direction.

Lead 24a wraps almost entirely around the first end 26b of the second lead 24b. The lead 24a as a whole encompasses an angle of about 300° around the center of the first end of 26b of the second lead. The bight 44a included in the main portion 27a of the lead encompasses an angle of slightly more than 180° around the center of first end 26b of the second lead. In the embodiment illustrated, the inner radius of bight 44a is about 0.035 mm greater than the radius of second end 26b, so that there is about 0.035 mm clearance between the inside of bight 44a and the outer edge of the first end 26b of the second lead.

The two leads in each pair 36 or congruent with one another, but rotated by 180° about the center point of the pair, i.e., the intersection 50 of the central axis of 41 and transverse axis 42. Thus, the features of second lead 24b are identical to the features of first lead 24a except that the directions are reversed; the first and transition section 40b of the second lead extends in the −Y direction from the first end 26b of the lead and slopes in the +X direction, whereas the second and transition section 46b extends in the +Y direction (upwardly in FIG. 4) and slopes in the −x direction.

Multiple pairs or units cells 36 are disposed in an array on the first surface 18 of the base or connection component. As seen in FIG. 3, the pairs are laid out along repeat lines 52 disclosed oblique to the X and Y coordinate directions. The lines are defined by lines passing through the center points 50 (FIG. 4) of the pairs of leads on the repeat line. For example, pairs 36a, 36b and 36c all lie on the same repeat line 52a, whereas pairs 36e, 36f and 36g lay on the next adjacent repeat line 52b. The repeat lines are disposed at a 45° angle toward the x and y coordinate directions. The spacing between adjacent pairs 36 on each repeat line is selected so that the Y-direction offset between the center points of adjacent pairs is equal to first end unit distance, i.e., equal to the Y-direction distance between the first ends of 26 the leads in each pair. Similarly, the X-direction distance between the center points of the adjacent pairs on the same repeat line is equal to the second end unit distance, i.e., equal to the distance between the second or tip ends 28 of the leads in a single pair. The spacing between adjacent repeat lines are selected so that the distance between repeat lines measured along the X or Y coordinates is equal to two full unit distances, i.e., 600 microns in the embodiment illustrated. Thus, the shortest distance between repeat lines along a line (not shown) perpendicular to the repeat lines is $2/\sqrt{2}$ unit distances i.e., 2/1.141 unit distances.

The pairs 36 are arranged on adjacent repeat lines 52 so that the center point 50 (FIG. 3) of each pair is aligned in the X directions with the center point of a pair in the next adjacent repeat line. The first and second ends of the leads in the various pairs form rows extending in the X direction and the columns extending in the y direction. Each X-direction row of lead first ends 26 includes the first ends of two leads in two different pairs on the same repeat line. For example, one such row includes the first end 26b of the second lead in pair 36a; followed by the first end 26a or the first lead in pair 36b on the same repeat line 52a, followed by the first end of the second lead in pair 36f on the next adjacent repeat line 52b, then the first end of the first lead in pair 36g on repeat line 52, and so on. Each Y-direction column of first ends includes the first ends of both leads in a single pair on a repeat line, followed by the first ends both leads of a pair in the next adjacent repeat line and so on. For example, one such Y-direction column of first ends includes the first ends 26 of both leads in pair 36b on repeat line 52a and the first ends of both leads in pair 36e on adjacent repeat line.

The second ends 28 of the leads in the various pairs are also arranged in rows extending in the X directions and columns extending in the Y directions. Each X-direction row of second ends includes the second ends 28 of both leads in a single pair on one repeat line followed by the second ends of a single pair on the next adjacent repeat line and so on. For example, one such X direction row includes second ends 28a and 28b of pair 36a on repeat line 52, followed by the second ends of the leads in pair 36f on repeat line 52b and the second ends of yet another pair on repeat line 52c. Each Y-direction column includes the second ends 28 of leads in two adjacent pairs on the same repeat line. For example, one such column includes the second end 28b of the second lead in pair 36b, followed by the second end 28a of the first lead in the adjacent pair 36a on the same repeat line, followed by the second end of the second lead in pair 36e on the next adjacent line 52b and so on. The pattern depicted in FIG. 3 includes only 9 pairs of leads; in practice, such a pattern can extend over the entire first surface of the connection component base, or over any part of such surface, and may includes hundreds or thousands of pairs. The pattern can be interrupted and the same or a different pattern can be provided on another portion of the surface. For example, where the connection component is to be engaged with a wafer or assemblage of chips having patterns of contacts interrupted by empty areas, the pattern of leads can have similar empty areas.

This pattern provides extraordinary long leads in a tightly packed arrangement which maintains adequate clearances. The pattern provides lead tip ends disposed at 300 micron center to center distances in X and Y dimensions. Notably, there is a substantial clearance around the tip end 28 of each lead. In the embodiment illustrated, no other lead is disposed closer than 0.08 mm (80 microns) to the center of the tip end 28 of a lead. In certain preferred embodiments, the length of each lead (measured from the center of its first or anchor end 26a to the center of the tip end 28a along the center line of the lead main portion) is about 0.625 millimeters. In the flat or undeformed condition of the leads illustrated in FIGS. 3 and 4, the second end transition sections 46 of leads in adjacent pairs on the same repeat line approach another closely, i.e., within about 25–35 microns of one another at a closest-approach point 55 (FIG. 3). However, as discussed below this does not result in a shorting between adjacent leads during use. In certain preferred embodiments, the straight line distance between the center of the tip end 28 and the center of the terminal end of a lead is about 0.155–0.160 millimeters.

Figure 1:
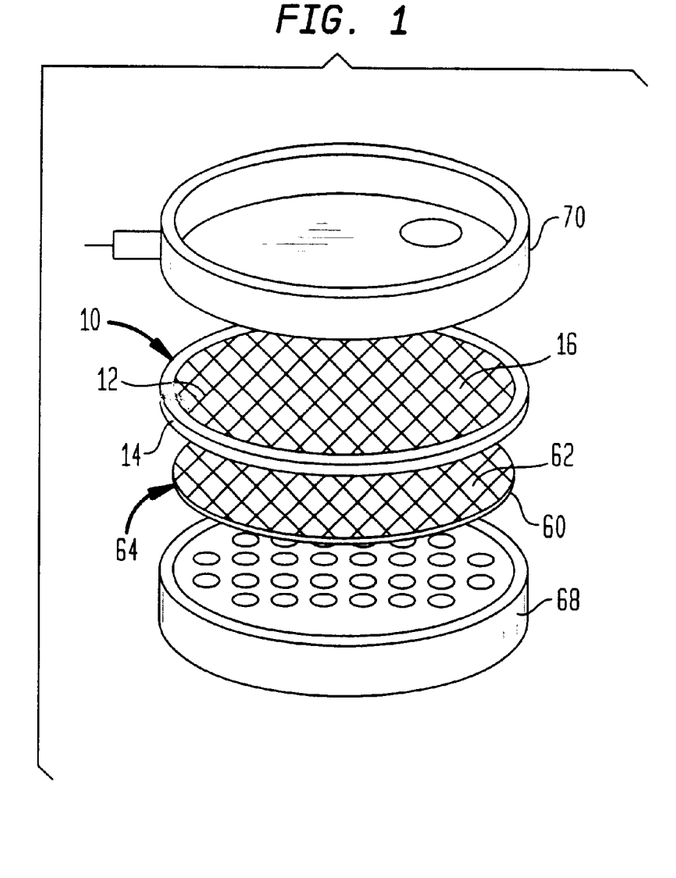
FIG. 1. is a diagrammatic perspective view showing elements used in a process according to one embodiment of the invention.
Figure 5:
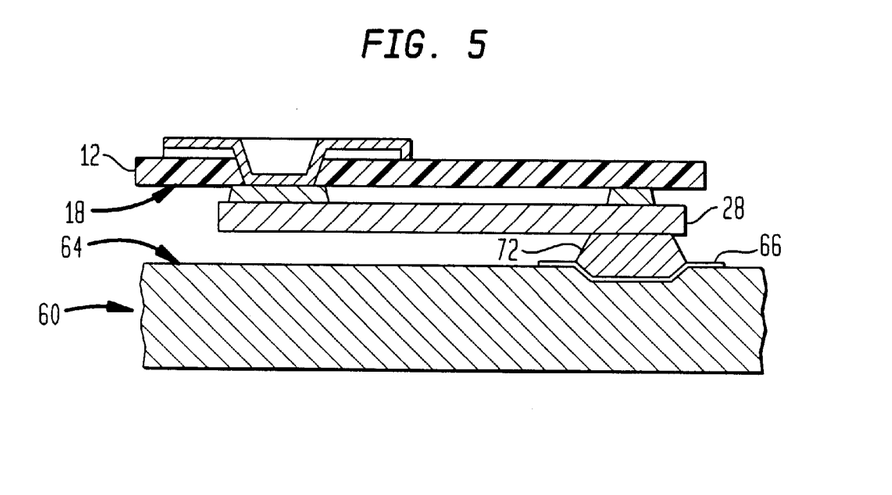
FIGS. 5 and 6 are views similar to FIG. 2, but depicting elements at later stages of the process.

In a method according to one embodiment of the invention, the connection component including the base 12 with leads 24 thereon is juxtaposed with a unitary wafer 60 (FIGS. 1 and 5). The wafer 60 incorporates a large number of individual semi-conductor chips 62 disposed side by side with "saw lanes" bounding the individual chips and separating the chips from one another. Each chip 62 incorporates numerous internal electronic components (not shown). The saw lanes are small, strip like regions of the wafer which do not include features required during use of the chips; the saw lanes will be destroyed when the chips are cut apart. The wafer has a front surface 64 (the surface visible in FIG. 1) with numerous contacts 64 exposed at the front surface. The contacts 66 of each chip are arranged in a pattern of rows and columns with spacing equal to the spacing of the lead second ends 28 on component 12. That is, the contacts are spaced apart from one another by distances in the X and Y directions on the surface of the chip equal to the unit distance of the lead array. The pattern of contacts 66 has rows extending in an X direction and columns extending in a Y direction. The base 12 of the connection component is juxtaposed with the wafer so that the first surface 18 of the base faces towards the front surface 64 of the wafer. Using a machine-vision system, the pattern of the tip ends 28 on the component is brought into registration with the pattern of complex 66 on the wafer. During this process, wafer 60 may be held on one fixture element 68 (FIG. 1) whereas component 12 and frame 14 may be held on an opposing element 70. The lead tip ends 28 are bonded to contacts 66. As illustrated in FIG. 5, these bonds may be provided by bonding material 72 carried on the lead tip ends, on the contact or both. The component base 12 and wafer 60 may be urged towards one another by urging fixture elements 68 and 70 towards one another, or by injecting a gas under pressure between fixture element 70 and base 12, or by any other apparatus in method for applying force to these components. Where the bonding material requires elevated temperature to form a bond, the components may be maintained at an appropriate elevated temperature to activate the bonding material. The use of a separate bonding material distinct from materials of the lead tip ends and contacts is not essential. For example, where the lead tip ends and contacts incorporate gold, the lead tip ends and contacts may include tin as an alloying constituent or as a very thin layer on the gold. At an elevated temperature, the tin and gold form a liquid phase at the interface between the lead tip end and the contact. With continued exposure to elevated temperature, the tin diffuses into the adjacent gold of the lead tip end and the contact, so that the microscopic liquid phase gradually looses tin and its solidus temperature rises. This process continues until the solidus temperature equals the prevailing elevated temperature, whereupon a solid bond forms between the lead tip end and contact. Any other expedient for bringing about bonding of the lead tip ends and contacts may be used. The steps of aligning the component with the wafer and bonding the lead tip ends to the contacts can be performed, for example, in substantially the same way as described in the '964 Patent. Other bonding procedures, such as vacuum bonding and IR bonding, may also be employed.

Figure 6:
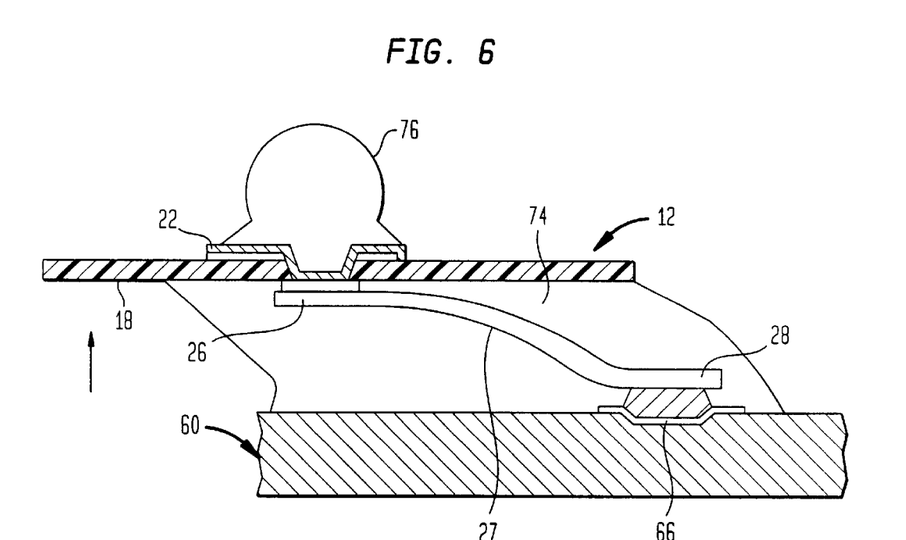

After the lead tip ends have been bonded to the contacts, the base 12 of the connection component and the wafer 60 are moved away from one another through a preselected displacement in a vertical or Z direction as indicated in FIG. 6. During this step, referred to as the "lifting" step, the lead tip ends 28 remain bonded to the contacts 66 of the wafer, whereas the anchor or first ends 26 of the leads move with the base 12. Thus, the main portions 27 of the leads are bent in the vertical or Z direction, away from the first surface 18 of the base 12 towards a vertically extensive disposition as diagrammatically illustrated in FIG. 6. As the first ends 26 of the leads move away from the tip ends 28 in the vertical direction, the distance between the tip end 28 of each lead and the anchor end of each lead increases. The original curvature of the main portions of the leads in the horizontal plane is distorted. As seen in plan view (FIGS. 3 and 4), the second end transition section 46 of each lead tends to swing inwardly, toward the central axis 41 of the lead pair. This tends to move the second end transition section away from the second end transition section of the neighboring lead in another pair on the same repeat line 52. This helps to assure that there will not be inadvertent contact between these leads in the completed assembly. This motion also brings the second end transition section 46 of each lead closer to the first end of the other lead in the same pair. For example, second end transition section 46a of lead 24a (FIG. 4) will tend to move in the −X direction, toward the first end 26b of the second lead in the same pair. Indeed, the second end transition section, the neighboring portion of bight 44a, or both, can be displaced in the horizontal directions to overlap the first end 26b of the opposite lead in the same pair. However, this does not pose a risk of contact between the two leads, because the second end transition section 46b and the neighboring portion of bight 44a are displaced in the vertical or Z direction away from the first end 26b of the opposite lead.

Figure 7:
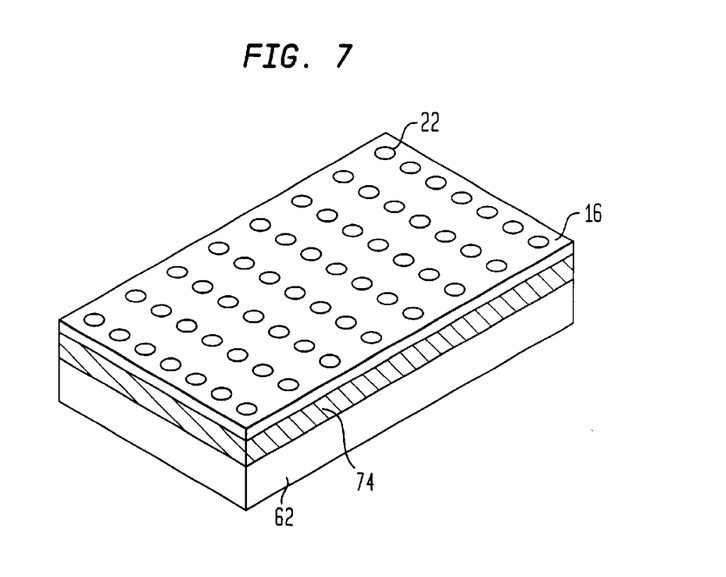
FIG. 7 is a diagrammatic perspective view of an assembly made in the process of FIGS. 1–6.

A flowable material is injected into the space 74 between the component 12 and wafer 60 during or after the lifting step. This flowable material is cured to form a layer, preferably a dielectric, compliant layer, as, for example, a dielectric gel, foam or elastomer, between the component 12 and wafer 60. A bonding material such as solder balls 76 may be applied to terminals 22. Before or after application of the bonding material, the base or component 12 and the wafer 60 may be severed by cutting along the saw lines above the wafer to form individual units 78 (FIG. 7) each including one chip 62, one individual portion 16 of the base of component 12 and a part of the compliant dielectric layer 74. Each such unit has terminals 22 connected to contacts 62. The resulting packaged chip units can be bonded to a circuit panel (not shown) or other structure by bonding the terminals 22 to the contact pads of the circuit panel.

Numerous variations and combinations of the features discussed above can be utilized without departing from the present invention. For example, the dimensions mentioned above can be varied. It is not essential for to have the first-end unit distance between first ends 26 of a pair equal to the second-end unit distance between the second ends 28 of a pair. Also, the roles of the first and second ends of the leads can be reversed; the second end 28 of each lead may be permanently attached to the component which initially carries the leads, whereas the first end 26 of each lead may be displaceable. Stated another way, the second ends 28 of the leads can serve as the anchor ends, and the second ends of the leads can serve as the tip ends.

Figure 8:
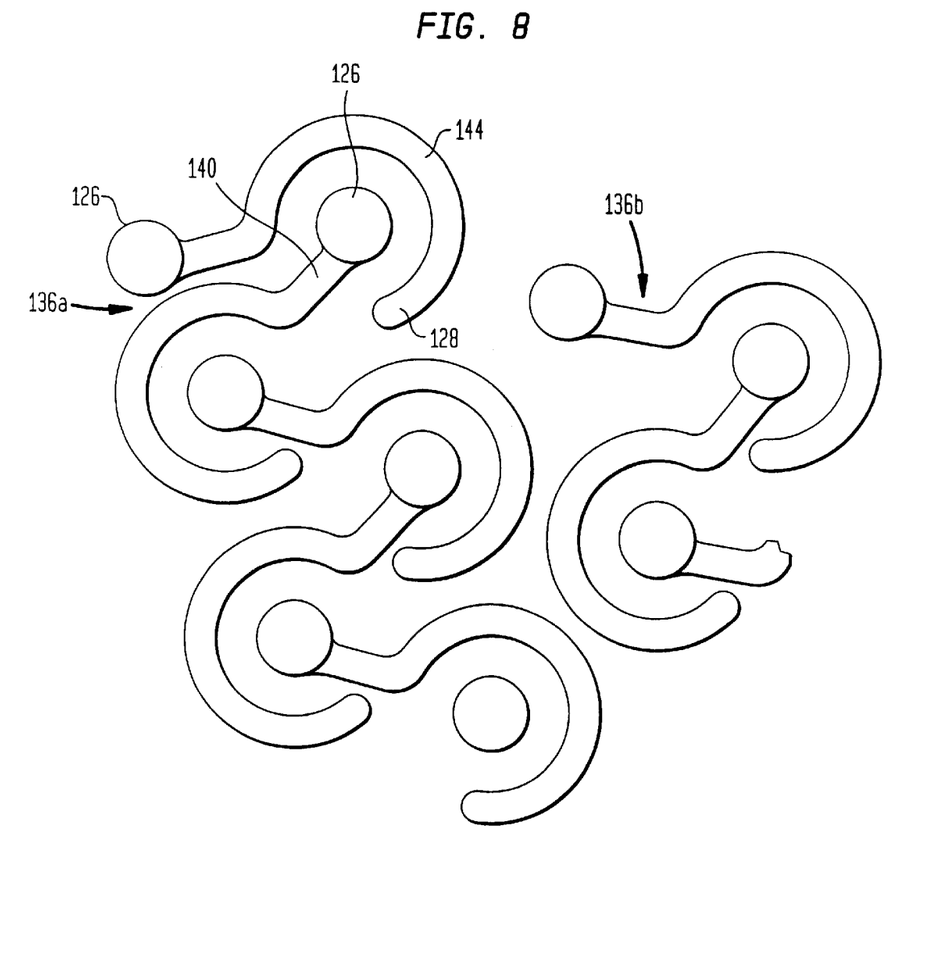
FIG. 8 is a fragmentary diagrammatic plan view depicting a portion of a component in accordance with another embodiment of the invention.
Figure 9:
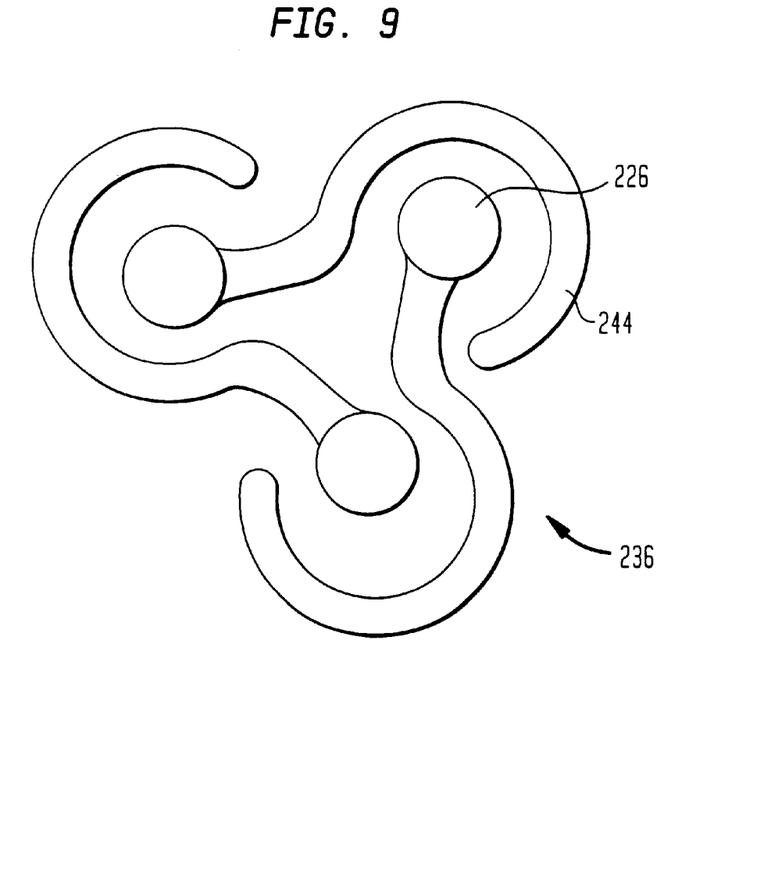
FIG. 9 is a fragmentary diagrammatic plan view depicting a portion of a component in accordance with a further embodiment of the invention.

Also, within the broad compass of the invention, it is not essential to provide the leads in pairs. For example, the leads may be provided in groups having more than two leads. A group of 3 leads, each having its first end 226 disposed in the interior area encompassed by a bight 244 of another lead in the same group, is depicted in FIG. 9. Groups of four or more leads can be employed. These groups can be tiled on the surface to form an array of any size. Moreover, it is not essential to provide the leads in defined groups at all. For example, as shown in FIG. 8, the leads may be provided in a sequential chain 136, with the first end 126 of each lead disposed in the interior area encompassed by a bight 144 of the next lead in the chain. Additional chains 136b can be disposed side-by-side with chain 136a. Here again, because the space within the interior area of each lead is occupied by the first end of another lead, the arrangement provides a relatively compact arrangement of leads.

In the embodiments discussed above, the leads are bonded to contacts of a wafer. However, the present invention can be used in making connections to an individual chip or to an assemblage of chips which are not part of a unitary wafer. For example, as disclosed in U.S. Pat. No. 5,798,286, the disclosure of which is incorporated by reference herein, numerous individual chips can be bonded to leads carried on a connection component, and the lifting procedure can be performed so as to bend the leads associated with all of these individual chips. Also, the invention can be performed using elements other than chips and connection components. For example, two circuit panels can be connected to one another using the procedures described above.

It is not essential to use the invention for every lead on the elements to be connected. For example, where a chip or other element has an array of densely-packed contacts on one part of its surface and other contacts which are disposed at greater pitch on another part of its surface, the densely-packed contacts can be connected using the invention, whereas the other contacts can be connected using leads of a different configuration.

Figure 10:
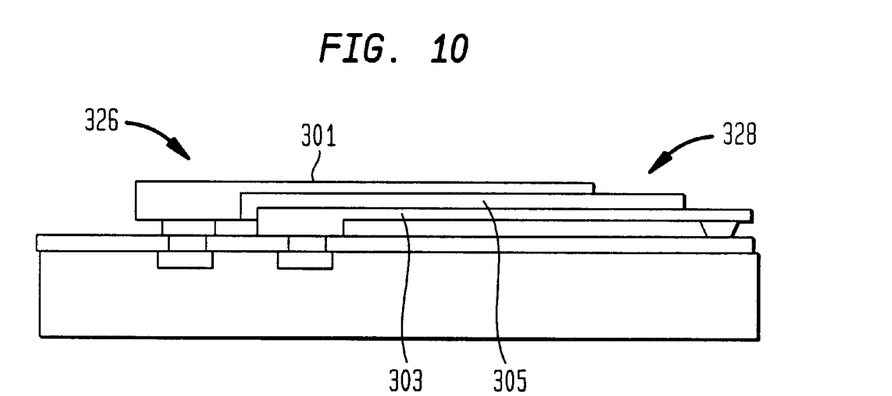
FIG. 10 is a view similar to FIG. 2 but depicting a component according to yet another embodiment of the invention.

The leads can incorporate any electrically conductive metal, such as copper, gold or alloys commonly referred to as shape memory alloys, also known as "pseudoelastic alloys" or "superelastic alloys" may be employed. Such alloys include Nitinol™ an alloy including nickel and titanium, and also include certain alloys of thallium and indium, as well as copper-aluminum-nickel alloys. Other conductive materials such as conductive polymers or metal-loaded polymers may be used. Also, the leads may include polymeric reinforcing layers in addition to the metal or other conductive material. As disclosed in certain preferred embodiments of U.S. Pat. No. 5,915,752, the disclosure of which is incorporated by reference herein, leads with metallic conductors may incorporate flexible polymeric reinforcement such as polymeric strips contiguous with the metallic conductors. The polymeric strips may be formed from a dielectric material as, for example, from the dielectric material of the component base. In a further variant, each lead may include a plurality of conductors. As disclosed in International Publications WO 97/11588 and WO 98/44564, the disclosures of which are incorporated by reference herein, the plural conductors of such a lead may include any combination of signal conductors and ground or other reference potential conductors. In one such arrangement, the plural conductors 301 and 303 are separated from one another by a dielectric polymer layer 305 which also serves as a physical reinforcement for the metallic layers. The conductors extend without touching one another between the anchor end 326 and the tip end 328 of the lead.

Figure 11:
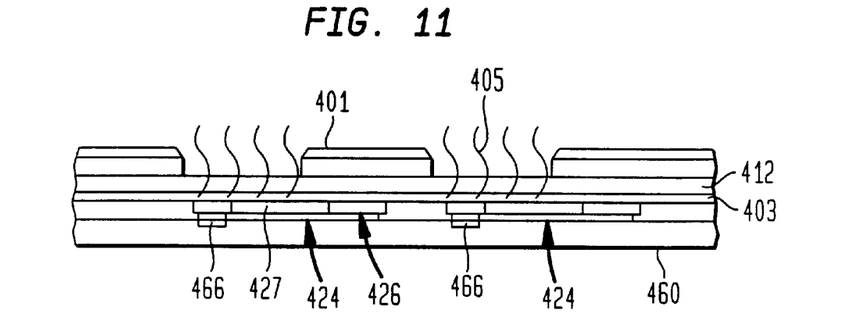
FIGS. 11–13 are fragmentary sectional views depicting elements at successive stages in a process according to yet another embodiment of the invention.
Figure 12:
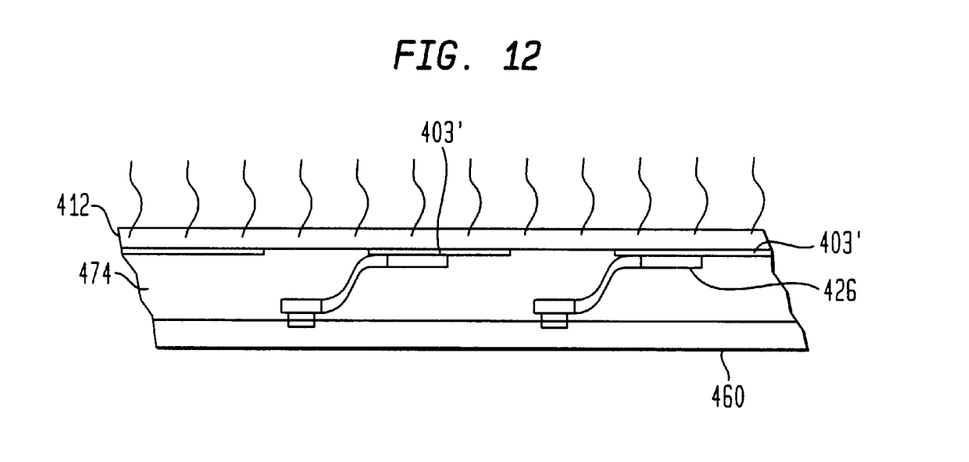
Figure 13:
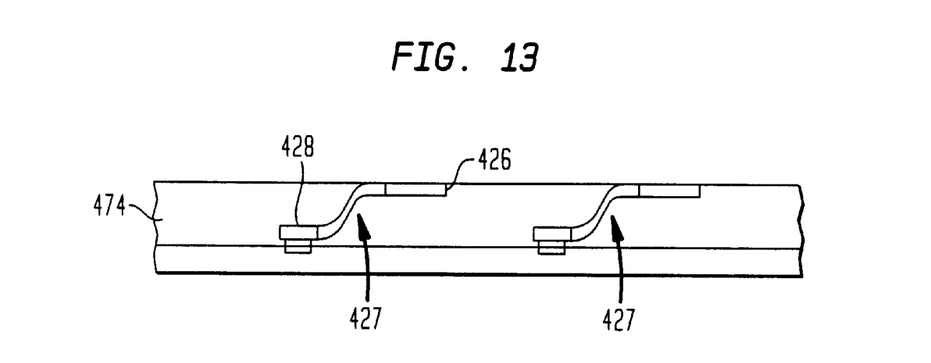

It is not essential for the base which initially carries the leads to remain in the finished product. For example, as disclosed in certain embodiments of U.S. patent application Ser. Nos. 09/267,058 filed Mar. 12, 1999 and 09/317,675, filed May 24, 1999, elongated leads may be formed by positioning a sheet of material on a temporary support or base and cutting through the sheet to form openings partially surrounding elongated regions of the sheet, so that such elongated regions are freed from their connection to the sheet over major portions of their lengths. The temporary support is removed, typically after connecting the leads to contacts on another component. Leads in accordance with the present invention may be formed in this way. Also, as disclosed in U.S. patent application Ser. No. 09/317,675, the disclosure of which is incorporated by reference herein, leads may be provided on a temporary support or base with a connecting layer such as an etchable metal or an adhesive which can be degraded by application of radiant energy as, for example, ultraviolet light. The support structure can be treated using a preselected treatment so as to release the tip ends of the leads from the support structure, and thus render the tip ends of the leads displaceable relative to the support structure, while leaving the anchor ends attached to the base. In the embodiment depicted in FIG. 11, the base or temporary support structure 412 is a plate formed from a material having a predictable, isotropic coefficient of thermal expansion and which is transparent to radiant energy in a degradation band as, for example, a glass or sapphire layer. The leads 424 are secured to the substrate through a thin connecting layer 403 formed from a material which can be degraded by radiation in the degradation band as, for example, an ultraviolet-degradable adhesive. The leads may be formed in place on this layer. After the tip ends 426 of the leads are aligned with and bonded to contacts 466 on the opposing element, radiant energy 405 in the degradation band such as ultraviolet light is applied through the base 412 so that it impinges on those portions of connecting layer 403 aligned with the tip ends 428 and main portions 427, but does not impinge on the portions of layer 403 aligned with the anchor ends 426. For example, an opaque mask 401 may be used to block the radiant energy at the anchor ends. After the lifting step, with the leads in the condition illustrated in FIG. 12, and after forming a dielectric layer 474 around the leads, the radiant energy is applied through remainder of the support to degrade the remaining portions 403' of the connecting layer, and thus release the anchor ends 426 of the leads from the support, leaving the anchor ends exposed at a surface of layer 474 remote from element 460, as depicted in FIG. 13.

As these and other variations and combinations of the features described above can be utilized, the foregoing description of the preferred embodiments should be taken by way of illustration rather than by way of limitation of the present invention.

What is claimed is:

1. A component for making microelectronic assemblies comprising:
   (a) a body having a surface; and
   (b) a plurality of nested leads extending over said surface, each of said nested leads having first and second ends and an elongated main section extending between said ends, the main section of each said nested lead being curved to encompass and partially surround an interior area of said surface, the first end of each said nested lead being disposed within the interior area encompassed by another one of said nested leads, wherein the first end of each said nested lead is an anchor end fixed to said body and the second end of each said nested lead is a tip end displaceable relative to said body, said leads being connected to said body so that said tip ends can be released from said body by a predetermined treatment which leaves the anchor ends fixed to said body.

2. A component as claimed in claim 1 wherein at least a portion of said main section adjacent the tip end being displaceable relative to said body.

3. A component as claimed in claim 1 wherein said nested leads are arranged in groups, and wherein the first end of each nested lead is disposed within the interior area encompassed by another lead in the same group.

4. A component as claimed in claim 1 wherein said nested leads are arranged in pairs, and wherein said first end of each nested lead is disposed within the interior area encompassed by the other lead in the same pair.

5. A component as claimed in claim 4 wherein the leads of each pair of nested leads are congruent with one another.

6. A component as claimed in claim 4 wherein the first end of each said nested lead has a width greater than the width of the main section of the same lead.

7. A component as claimed in claim 6 wherein the first end at each said nested lead has a width greater than the width of the second end of the same lead.

8. A component as claimed in claim 7 wherein the second end of each said nested lead has width greater than the width of the main section adjacent such tip end.

9. A component as claimed in claim 8 wherein said nested leads include a plurality of pairs of nested leads disposed adjacent one another in an array of pairs.

10. A component as claimed in claim 6 wherein the main region of each said nested lead extends through an angle of at least about 150° around a center point within first end of the other lead in the same pair.

11. A component as claimed in claim 10 wherein the first end of each nested lead is generally circular, and the diameter of each such generally circular first end is greater than the width of the main section adjacent such first end.

12. A component as claimed in claim 11 wherein the main portion of each nested lead includes an arcuate bight concentric with the first end of the other lead in the same pair.

13. A component as claimed in claim 6 wherein each said nested lead has a tapered section at the juncture between the first end and the main section of such lead.

14. A component comprising:
   (a) a base having a surface, whereby location on said surface is defined by a coordinate system including a +X direction, a −X direction opposite to said +X direction, a +Y direction perpendicular to said X directions and a −Y direction opposite to said +Y direction; and
   (b) a plurality of pairs of nested leads extending over said surface, the leads of each said pair including a first lead and a second lead, each said nested lead having a first end, a second end and an elongated main portion extending between such ends, the main portion of each said nested lead being curved to encompass and partially surround the first end of the other lead in the same one of said pairs, the second lead of each said pair having its first end offset from the first end of the first lead in the +Y direction, wherein the first end of each said nested lead is an anchor end fixed to said base and the second end of each said nested lead is a tip end, said leads being connected to said base so that said tip ends can be released from said base by a predetermined treatment which leaves the anchor ends fixed to said base.

15. A component as claimed in claim 14 wherein the tip ends of said leads are displaceable relative to said base.

16. A component as claimed in claim 14 wherein said pairs are arranged along one or more repeat lines at an oblique angle to said +Y direction.

17. A component as claimed in claim 16 wherein said one or more repeat lines includes a plurality of repeat lines extending parallel to one another, so that the pairs of leads in the plural repeat lines form an array extending in said X and Y directions and wherein the first ends of the leads are disposed in rows parallel to said X direction.

18. A component as claimed in claim 17 wherein said pairs are spaced along said repeat lines so that, except at ends of the repeat lines, the first end of the second lead in each said pair lies on the same row as the first end of the first lead in the next succeeding pair on the same repeat line.

19. A component as claimed in claim 18 wherein at least some of the first ends of leads in pairs on different repeat lines are aligned with one another in the X directions, whereby such aligned first ends extend in columns parallel to the Y directions.

20. A component as claimed in claim 19 wherein the first ends of the leads in each pair are aligned with one another in the X directions whereby the first ends of the leads define a central axis of the pair parallel to the Y directions and the first ends of the leads in each pair lie in the same one of said columns.

21. A component as claimed in claim 20 wherein the main portion of the first lead in each pair includes a proximal region extending from the first end of such lead in the +Y direction, a bight extending from the proximal region around the first end of the second lead in each pair, and a distal region extending in the −Y direction from the bight to the second end of such lead, and wherein the main portion of the second lead in each pair includes a proximal region extending from the first end of such lead in the −Y direction, a bight extending from the proximal region around the first end of the first lead in each pair, and a distal region extending in the +Y direction from the bight to the second end of such lead.

22. A component as claimed in claim 21 wherein the proximal region of the main portion of the first lead in each pair extends in the −X direction, and wherein the proximal region of the main portion of the main portion of the second lead in each pair extends in the +X direction.

23. A component as claimed in claim 22 wherein the proximal region of the main portion of the first lead in each pair is curved, and has a center of curvature offset from such proximal region in the −X direction, and wherein the proximal region of the main portion of the second lead in each pair is curved about a center of curvature offset from such proximal region in the +X direction.

24. A component as claimed in claim 21 wherein the second ends of the leads in each said pair are aligned with one another in the Y coordinate.

25. A component as claimed in claim 21 wherein the second ends of the leads in said array are disposed in rows extending parallel to the X direction.

26. A method of making connections comprising the steps of:

(a) providing first and second elements and a plurality of generally planar nested leads connected between said elements, each of said nested leads having a first anchor end fixed to the first element, a second end displaceable relative to said first element and connected to the second element and an elongated main section extending between said ends, the main section of each said nested lead being curved to encompass and partially surround the first anchor end of another one of said nested leads; and then b) in a lifting Step, moving said first and second elements away from one another with a component of motion in a vertical direction normal to the plane of the leads so as to bend said nested leads into a vertically-extensive disposition.

27. A method as claimed in claim 26 wherein said nested leads are arranged in groups, and wherein said first anchor end of each nested lead is encompassed within and partially surrounded by the elongated main section of another lead in the same group.

28. A method as claimed in claim 26 wherein said nested leads are arranged in pairs, and wherein said first anchor end of each nested lead is encompassed within and partially surrounded by the elongated main section of the other lead in the same pair.

29. A method as claimed in claim 28 wherein a portion of each nested lead adjacent the second end of the lead moves with a horizontal component of motion toward the first end of the other lead in the same pair during said lifting step.

30. A method as claimed in claim 26 wherein said step of providing said elements includes providing said leads on said first element, juxtaposing said first element with said second element and bonding the second ends of the leads to contacts on the second element.

31. A method as claimed in claim 20 wherein said first element includes a connection component and said second element includes one or more semiconductor chips.

32. A method as claimed in claim 30 wherein said contacts on said second element are disposed at a pitch of less than tout 500 microns.

* * * * *

UNITED STATES PATENT AND TRADEMARK OFFICE
CERTIFICATE OF CORRECTION

PATENT NO. : 6,632,733 B2
DATED : October 14, 2003
INVENTOR(S) : Ilyas Mohammed

It is certified that error appears in the above-identified patent and that said Letters Patent is hereby corrected as shown below:

Column 1,
Line 41, "overly" should read -- overlie --.

Column 3,
Line 14, "chips" should read -- chip --.
Line 54, cancel "to provide adequate".

Column 6,
Line 66, "is" should read -- are --.

Column 7,
Line 20, cancel "of".
Line 60, cancel "in the".

Column 8,
Lines 1 and 46, "-x" should read -- -X --.
Line 56, "x and y" should read -- X and Y --.

Column 9,
Line 10, "y" should read -- Y --.

Column 11,
Line 54, cancel "for".

Column 12,
Line 39, after "Nitinol$^{TM}$" insert -- , --.

Column 13,
Line 41, "release" should read -- releases --.

Column 14,
Line 2, "being" should read -- is --.
Line 21, insert -- a -- between "has" and "width".
Line 28, insert -- the -- between "within" and "first".

UNITED STATES PATENT AND TRADEMARK OFFICE
CERTIFICATE OF CORRECTION

PATENT NO. : 6,632,733 B2
DATED : October 14, 2003
INVENTOR(S) : Ilyas Mohammed

It is certified that error appears in the above-identified patent and that said Letters Patent is hereby corrected as shown below:

Column 15,
Line 38, cancel "of the main portion".

Column 16,
Line 17, "Step" should read -- step --.
Line 42, "20" should read -- 30 --.
Line 47, "tout" should read -- about --.

Signed and Sealed this

Sixth Day of April, 2004

JON W. DUDAS
*Acting Director of the United States Patent and Trademark Office*